United States Patent [19]
Swanson

[11] Patent Number: 5,969,571
[45] Date of Patent: Oct. 19, 1999

[54] PULSE DURATION AMPLIFIER SYSTEM

[75] Inventor: Hilmer Irvin Swanson, Quincy, Ill.

[73] Assignee: Harris Corporation, Melbourne, Fla.

[21] Appl. No.: 09/025,045

[22] Filed: Feb. 17, 1998

[51] Int. Cl.[6] .................................................. H03F 3/38
[52] U.S. Cl. ........................................... 330/10; 330/149
[58] Field of Search ...................... 330/10, 149, 207 A, 330/251, 124 R, 295; 332/31 R

[56] References Cited

U.S. PATENT DOCUMENTS

| | | | |
|---|---|---|---|
| 4,164,714 | 8/1979 | Swanson | 330/10 |
| 4,468,626 | 8/1984 | Swanson | 330/10 |
| 5,216,376 | 6/1993 | Swanson | 330/10 |
| 5,387,875 | 2/1995 | Tateno | 330/10 |
| 5,479,337 | 12/1995 | Voigt | 363/131 |
| 5,613,010 | 3/1997 | Heyl et al. | 381/117 |

*Primary Examiner*—Robert Pascal
*Assistant Examiner*—Henry Choe
*Attorney, Agent, or Firm*—Tarolli, Sundheim, Covell, Tummino & Szabo

[57] ABSTRACT

A pulse duration modulation (PDM) amplifier system having a plurality of PDM carrier signals of like frequency but unlike phase. A first pair of PDM amplifiers responds to a common modulating input signal. Each amplifier pulse duration modulates a corresponding one of the PDM carrier signals. Each PDM amplifier has an output circuit. A common filter is associated with each pair of PDM amplifiers for filtering the corresponding signals obtained from the output circuits of the pair of PDM amplifiers and providing output signals on a filter output line. The output circuit of each PDM amplifier is coupled to the common filter.

6 Claims, 4 Drawing Sheets

5,969,571

PULSE DURATION AMPLIFIER SYSTEM

BACKGROUND OF THE INVENTION

The present invention relates to pulse duration amplifiers and, more particularly, to improvements therein.

Pulse duration modulation (PDM) is frequently employed in power amplifiers to achieve efficiency of operation. In such amplifiers, an input signal, such as an audio signal, is used to pulse modulate a carrier signal, and the resulting PDM signal is amplified. The amplified PDM signal is then filtered to recover a modulated signal corresponding to an amplified version of the input audio signal.

A polyphase PDM amplifier is disclosed in U.S. Pat. Nos. 4,164,714, 4,468,626 and 5,216,376 to H. Swanson and assigned to the assignee herein. These patents disclose a system wherein an amplified signal is formed by combining the outputs of plural parallel-connected PDM amplifiers. All of the amplifiers respond to a common input signal, but have differently phased carrier signals. Polyphase PDM amplifiers of this type enjoy various advantages over earlier, single phase PDM amplifiers. For example, amplifier elements employed in polyphase PDM amplifiers operate at relatively low switching frequencies and power levels, permitting semi-conductor devices to be used as the active amplifier elements instead of vacuum tube devices.

The switching frequencies at which the PDM amplifiers operate serve to drive a switching device such as a semi-conductor to generate a train of squarewave pulses of fixed magnitude but variable pulse width in dependence on the on-off time durations of the semi-conductor switching device.

In the PDM amplifier systems described in the noted patents, each of the PDM amplifiers employs a semi-conductor switching device. Each switching device, in turn, supplies output PDM pulses to an output circuit which includes a low-pass filter which filters the amplified PDM output signal pulses to recover an amplified input signal. This filter includes an inductor through which current continuously flows. The maximum cutoff frequency of the filter is proportional to the PDM pulse frequency. For example, a prior art PDM amplifier system constructed in accordance with the noted patents may have a PDM frequency on the order of 70 KHz. In such case, the maximum cutoff frequency is about 20 KHz and the maximum usable frequency is about 10 KHz. It is to be noted that such a filter is sensitive to load impedance changes at frequencies near its cutoff frequency and therefore if the cutoff frequency can be increased the filter will be less sensitive to the changes. Also, instead of increasing the cutoff frequency of the filter the PDM frequency can be decreased which will permit use of lower cost devices, such as IGBTs.

SUMMARY OF THE INVENTION

It is therefore an object of the present invention to provide a PDM amplifier system having improvements to achieve greater filter cutoff frequency by combining the outputs of single phase PDM modulators prior to the output filter stage.

In accordance with one aspect of the present invention such an improved pulse duration modulation (PDM) amplifier system is accomplished by apparatus which includes the provision of a plurality of PDM carrier signals of like frequency but unlike phase. A first pair of PDM amplifier means are provided and which respond to a common modulating signal for each pulse duration modulating a corresponding one of the PDM carrier signals in accordance therewith. Each of the PDM amplifiers has an output circuit. A common filter is associated with the pair of PDM amplifiers for filtering the corresponding signals obtained from the output circuits of the pair of PDM amplifiers and then providing output signals on a filter output line. The output circuits of the PDM amplifiers are coupled to the common filter.

BRIEF DESCRIPTION OF THE DRAWINGS

The foregoing and other objects and advantages of the present invention will become more readily apparent from the following description as taken in conjunction with the accompanying drawings, wherein:

FIG. 1 illustrates a prior art polyphase PDM amplifier based on that disclosed in my previous U.S. Pat. Nos. 4,468,626 and 5,216,376. The polyphase PDM amplifier includes plural PDM amplifier stages 10, 12, 14 and 16 connected in parallel between a common input source 18 and a common output device 20. Each amplifier stage receives a modulating input signal and a PDM carrier signal. The four stages 10, 12, 14, and 16 receive the same modulating input signal provided by an input source 18, but receive different carrier signals. The carrier signals provided to the four PDM amplifiers stages 10, 12, 14 and 16 are all generated by a PDM carrier source 22 which generates four squarewave signals of common frequency but different phase. These four carrier frequencies are preferably equally displaced in phase. More particularly, the four carrier signals are displaced in phase by 90° with respect to one another whereby the four carrier signals have relative phases of 0°, 90°, 180°, and 270°.

Figure 1:
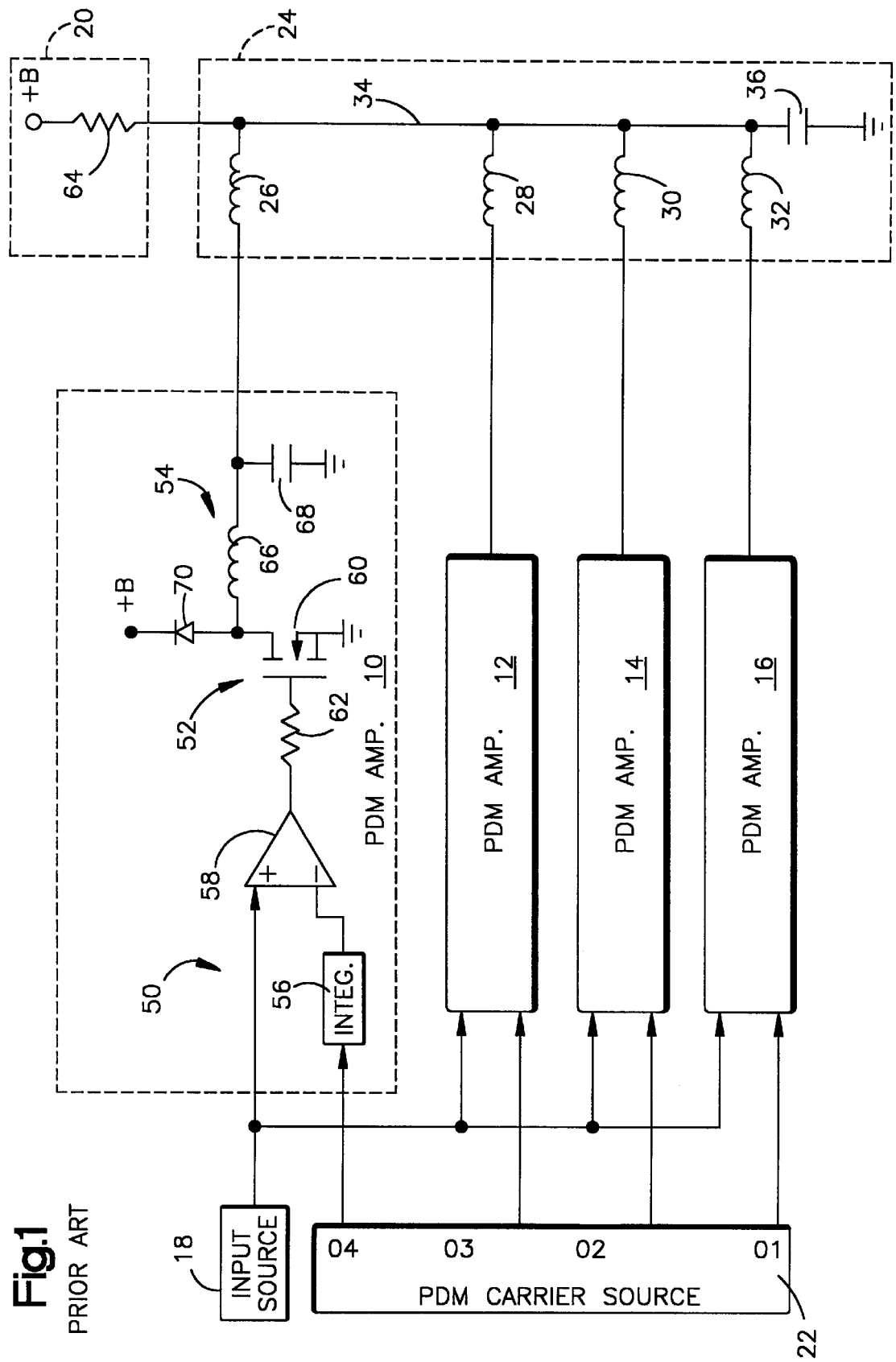
FIG. 1 is a schematic-block diagram illustration of a prior art PDM amplifier system.

The PDM amplifier stages are all identical to stage 10, which is shown in detail in FIG. 1 and will be described hereinafter. Generally, each stage pulse duration modulates its respective PDM carrier signal provided by PDM carrier source 22, amplifies the resulting PDM signal, and thereafter filters the amplified PDM signal to recover an amplified input signal. The amplified signal is, in each case, applied to the amplifier output.

The four amplified signals provided by the four PDM amplifier stages are combined in a combiner circuit 24 to form a combined amplified signal for application to output device 20. The combiner circuit may, of course, take many forms, but is shown in FIG. 1 as including inductors 26, 28, 30, and 32, each connected between the output of a corresponding PDM amplifier stage and a common node 34, which represents the output of the combiner. A capacitor 36 is connected between the common node 34 and ground. The inductors and capacitor not only add the four amplifier output signals together, but also provide an additional stage of filtering. Each of the inductors 26–32 represents the "series" element of a half section low-pass filter, where the capacitor 36 represents the single, common "shunt" element for all of the filters.

The combined amplified signal appears on the common node 34, which represents the output of the polyphase PDM amplifier. Any suitable utilization device 20 may be connected to the output of the polyphase PDM amplifier for using the amplified signal which it provides.

FIG. 1 also shows one exemplary form which the amplifier stage 10 may take. The amplifier stage 10 is shown as including a PDM modulator 50, a pulse amplifier 52, and a PDM filter 54. The PDM modulator includes an integrator 56 and a comparator 58. The integrator 56 integrates the squarewave carrier signal provided by carrier source 22 to provide a triangular wave signal of similar frequency and phase on its output. The comparator 58 has its noninverting (+) input connected to input source 18 and its inverting (−) input connected to the output of the integrator 56. When thus connected, the output of comparator 58 will be at a high voltage level (e.g., +B) when the input signal is greater than the instantaneous level of the triangular wave, and a low voltage level (e.g., ground potential) when the input signal is below the instantaneous level of the triangular wave. As long as the input signal level is below the peak level of the triangular wave, the output of the comparator is a pulse duration modulated signal.

The pulse duration modulated signal is a bi-level signal comprised of periodic pulses of fixed frequency (the frequency of the triangular wave) and variable duration. The duration of the pulses is related to the level of the input signal. In the example being described, the pulse duration is directly proportional to input signal level.

The PDM signal is amplified by a pulse amplifier 52, which in FIG. 1 is shown as a conventional single transistor, class "D" amplifier. The amplifier includes a field effect transistor 60 (FET) whose gate is connected to the output of comparator 58 through a current limiting resistor 62. The FET is connected to the amplifier output through filter 54. The amplifier output is in turn connected to a DC supply voltage (+B) through a load 20, which is characterized as a resistor 64 in FIG. 1.

The FET's drain-source current path is therefore connected in series with filter 54 and load 20 across a +B supply. The conductive state of transistor 60 switches in unison with the PDM signal, thereby applying an amplified PDM signal across filter 54 and load 20.

The low-pass filter 54 filters the amplified PDM signal to recover an amplified input signal. The filter includes an inductor 66 an capacitor 68. The capacitor is connected between the amplifier output and ground. The values of inductor 66 and capacitor 68 are selected so that the filter has a cutoff frequency above the highest frequency of the input signal and below the frequency of the PDM carrier signals provided by PDM carrier signal source 22. A free wheeling diode 70 is connected between the transistor 60 and the +B supply to clip the inductive spikes.

The transistor 60 serves as a switch which is turned on by the PDM signal and remains on for a time duration dependent on the width of the PDM signal. Transistor 60 has an output circuit which is connected in series with inductors 66 and 26 and load 64 across the DC supply voltage (+B).

In the system described above relative to FIG. 1 it is to be noted that each PDM amplifier has an output filter 54 associated therewith. The pulses supplied to the filter from the PDM switch 52 are at the PDM frequency. The inductor 66 in the filter has low inductance level (for low distortion) and is proportional to the PDM frequency. For low distortion, the current in the inductor 66 should be continuous. Because of this, the maximum cutoff frequency of the filter 54 is proportional to the PDM frequency. For example, the maximum cutoff frequency of a PDM modulator operating at 70 KHz is about 20 KHz. Consequently the maximum usable frequency is about 10 KHz. A filter, such as filter 54 is sensitive to load impedances at frequencies near its cutoff frequency and, hence, increasing the cutoff frequency will make the filter less sensitive to changes. Also instead of increasing the cutoff frequency of the filter, the PDM frequency can be decreased by a factor of N. This can be used to make it possible to use low cost devices such as IGBTs.

In accordance with the present invention, the output circuits of PDM amplifiers (as taken at the output of PDM switch 52) are combined prior to the PDM filter, such as filter 54 in FIG. 1. A single two-phase PDM filter connected to the output circuits of two PDM amplifiers can have a greater cutoff frequency when operating at 70 KHz with the greater cutoff frequency being at approximately 40 KHz with a usable frequency beyond 20 KHz. Three embodiments of invention are presented herein at FIGS. 2, 3, and 4 to which attention is now directed.

Figure 2:
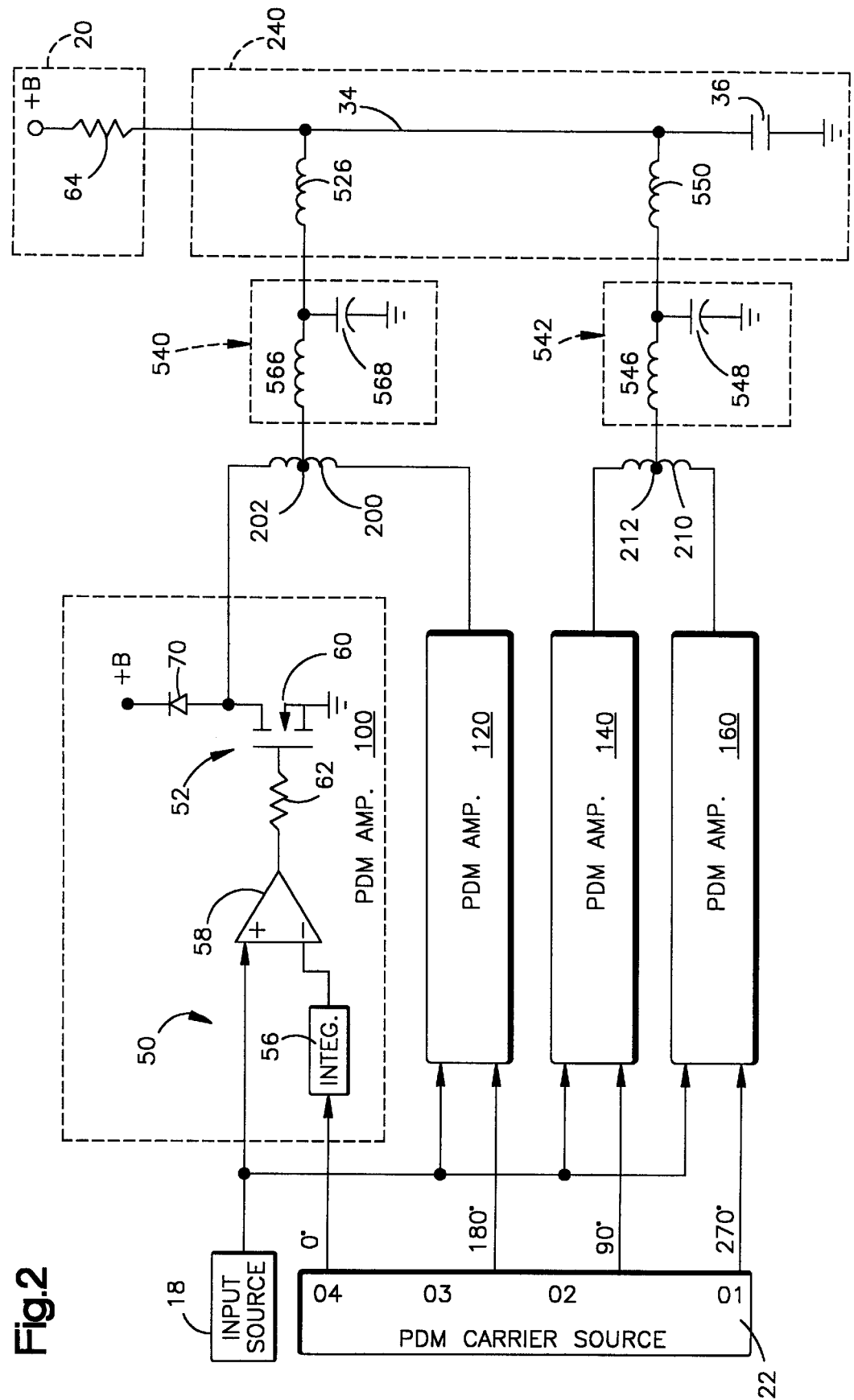
FIG. 2 is a schematic-block diagram illustration of a first embodiment of the invention herein.

Reference is now made to FIG. 2 which is similar to the prior art of FIG. 1 and consequently, similar components are identified with like character references to simplify the description herein. In the embodiment of FIG. 2 there is provided four (4) PDM amplifiers 100, 120, 140, and 160. Each amplifier takes the form of PDM amplifier 100. This amplifier includes a modulator 50 together with a PDM switch 52, as in the case of FIG. 1, but does not include a PDM filter, such as filter 54, in FIG. 1. Instead, the output circuit of switch 52 in PDM amplifier 100 is connected to the output circuit of a corresponding switch 52 in the PDM amplifier 120 by means of a tightly wound transformer coil 200 having a center tap 202. The center tap connects the output circuits of the PDM amplifiers 100 and 120 with a single PDM filter 540 with the filtered output signals being supplied to an inductor 526 which is connected to a common node 34 in a combiner 240. It is to be noted that the carrier signals supplied to the PDM amplifiers 100 and 120 are out of phase with respect to each other by 180°.

FIG. 2 shows a second pair of PDM amplifiers 140 and 160 constructed in the same manner as PDM amplifiers 100 and 120 discussed above. The output circuits of the PDM switches of amplifiers 140 and 160 are connected to opposite ends of a transformer coil 210 having a center tap 212 connected to a single PDM filter 542 constructed in the same manner as that discussed above with respect to filter 540. Filter 542 includes an inductor 546 and a capacitor 548. This filter is connected to the node 34 in combiner 240 by means of an inductor 550. The embodiment in FIG. 2 provides circuitry by which a first pair of PDM amplifiers 100 and 102 are coupled to a single filter 540 and a second pair of PDM amplifiers 140 and 160 are coupled to a second common filter 542.

Figure 3:
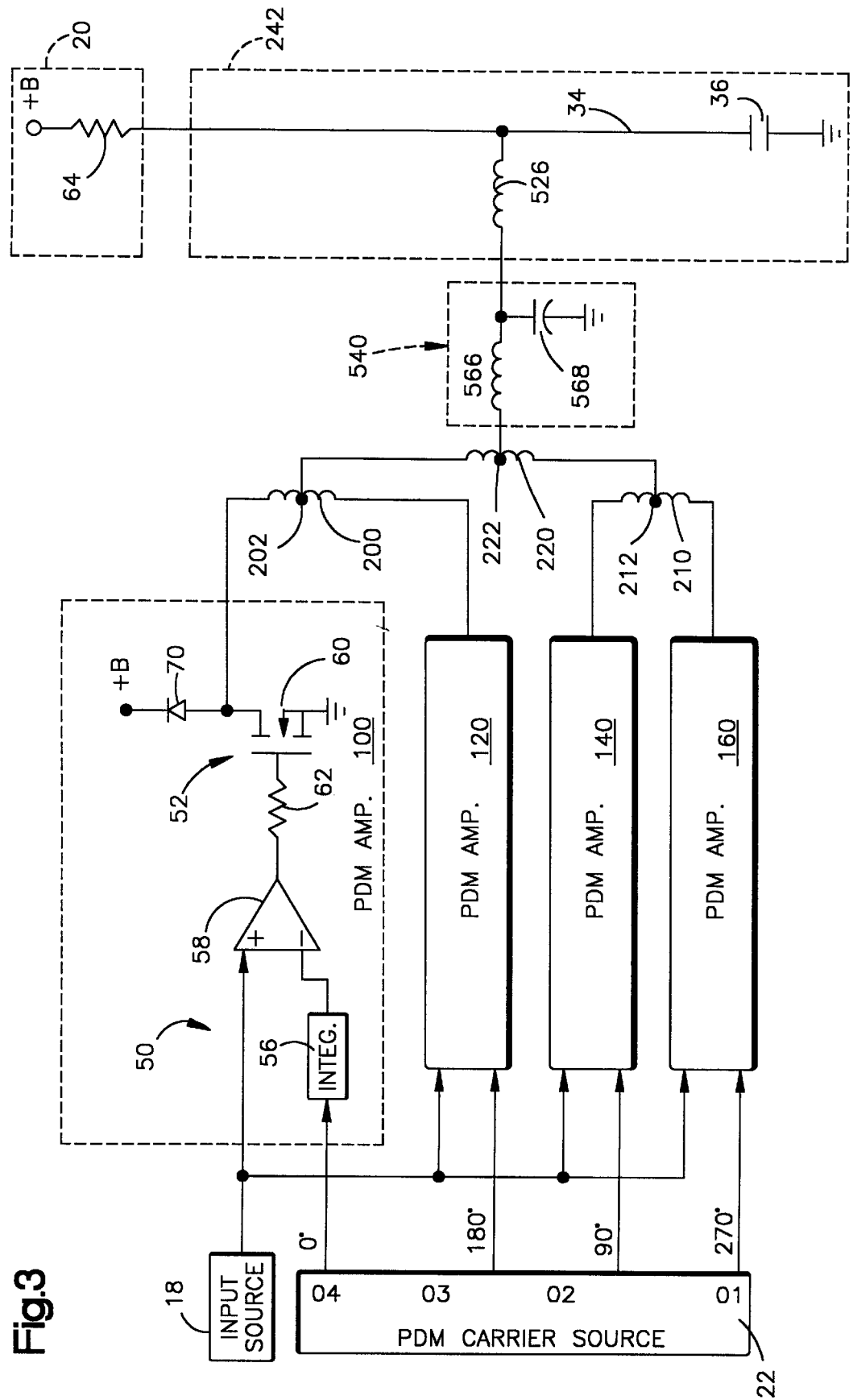
FIG. 3 is a schematic-block diagram illustration of a second embodiment of the invention herein; and, FIG. 4 is a schematic-block diagram illustration of a third embodiment of the invention herein.

Reference is now made to FIG. 3 which illustrates a second embodiment of the invention. This embodiment is quite similar to that of FIG. 2 and consequently like components will be described using like character references. Only the differences will be described in detail to simplify the description of the invention herein.

The embodiment of the invention shown in FIG. 3 also includes four (4) PDM amplifiers 100, 120, 140 and 160 corresponding to those in FIG. 2. Also the PDM switch output circuits of amplifiers 100 and 120 are connected together by means of a transformer coil 200 and the PDM output circuits of amplifiers 140 and 160 are connected together by means of transformer coil 210. However, in the embodiment of FIG. 3 the center taps 202 and 212 of transformer coils 200 and 210 are connected to opposite ends of another transformer coil 220 having a center tap 222 connected to a single PDM filter 540 which is connected by way of an inductor 526 to the load 64. This circuit provides two (2) pairs of PDM amplifiers with a single common PDM filter 540 as opposed to the two PDM filters 540 and 542 in the embodiment of FIG. 2.

Figure 4:
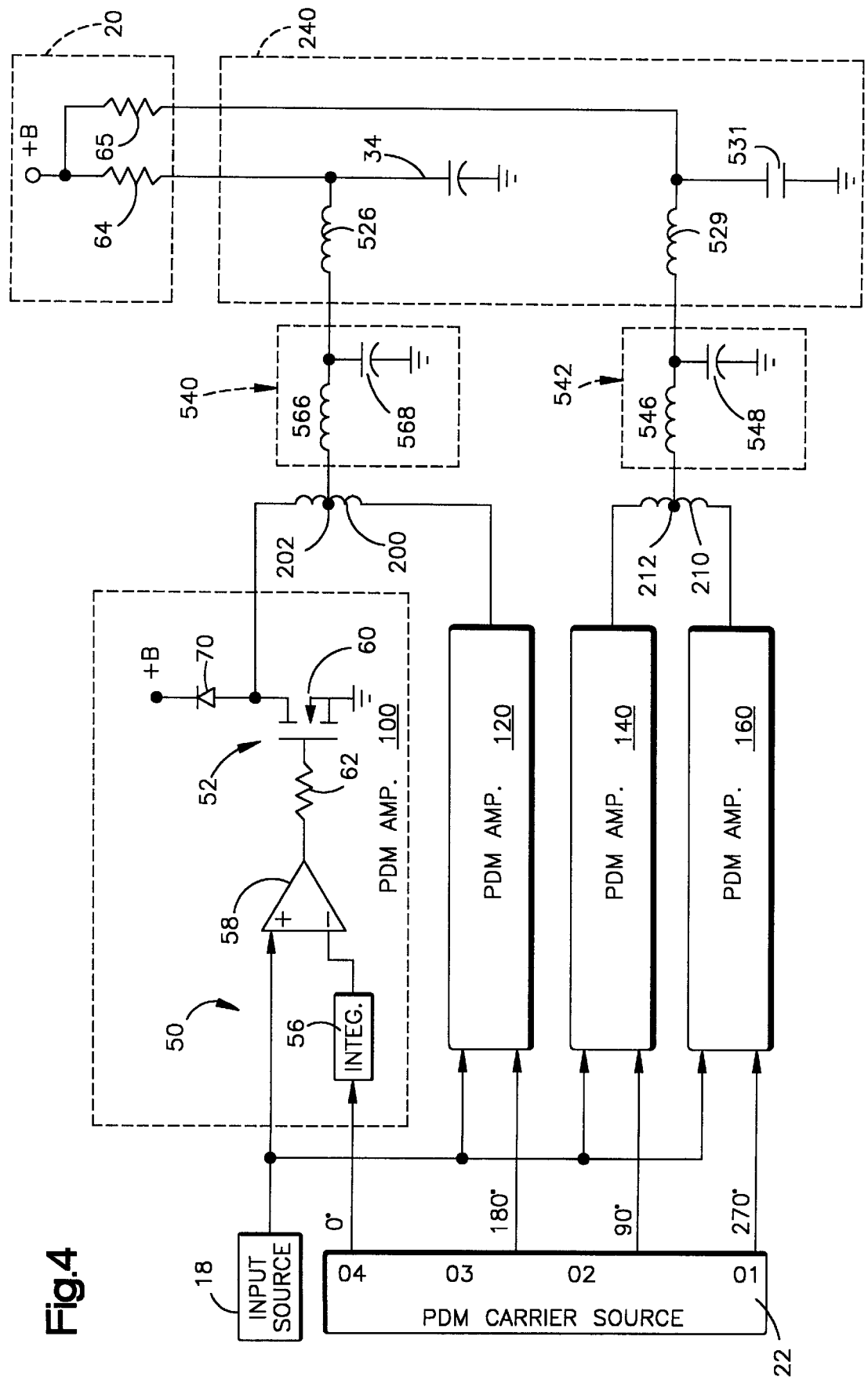

Reference is now made to FIG. 4 which illustrates a third embodiment of the invention herein. The embodiment of FIG. 4 is quite similar to that of the embodiment of FIG. 2 and consequently like components are identified with like character references herein. Only the differences between the two embodiments is described in detail below to simplify the description of the invention herein.

The embodiment of FIG. 4 like the embodiment of FIG. 2 includes four (4) PDM amplifiers and two (2) PDM filters 540 and 542 with each filter connected to an associated pair of PDM amplifiers. In this embodiment, however, each of the PDM filters is connected to an associated load through another filter. Thus, filter 540 is connected to load 64 by way of a filter including inductor 526 and a capacitor 527. Filter 542 is connected to a second load 65 by way of a filter including inductor 529 and capacitor 531.

It is to be appreciated that in each embodiment of FIGS. 2, 3, and 4 a PDM filter is associated with a pair of PDM amplifiers by way of a tightly coupled transformer winding in order to combine two PDM pulse trains.

From the above description of the invention, those skilled in the art will perceive improvements, changes and modifications in the invention. Such improvements, changes and modifications within the skill of the art are intended to be covered by the appended claims.

Although the invention has been described with respect to preferred embodiments, it will be appreciated that various modifications may be made without departing from the spirit and scope of the invention as defined by the appended claims.

Having described the invention, I claim:

1. A pulse duration modulation (PDM) amplifier system comprising:
   means for providing a plurality of PDM carrier signals of like frequency but unlike phase;
   a first pair of PDM amplifier means all responsive to a common modulating input signal for each pulse duration modulating a corresponding one of said PDM carrier signals in accordance therewith, each said PDM amplifier means having an output circuit;
   common filter means associated with said pair of PDM amplifier means for filtering the corresponding signals obtained from the output circuits of said pair of PDM amplifier means and providing output signals on a filter output line;
   means for coupling the output circuit of each said PDM amplifier means with said common filter means;
   said coupling means for coupling the output circuits of said pair of PDM amplifier means includes a transformer coil having a first end connected to the output circuit of one of said PDM amplifier means and a second end connected to the output circuit of the other said PDM amplifier means; and,
   said transformer coil has a center tap and wherein said common filter means is connected to said center tap.

2. A pulse duration modulation (PDM) amplifier system comprising:
   means for providing a plurality of PDM carrier signals of like frequency but unlike phase;
   a first pair of PDM amplifier means all responsive to a common modulating input signal for each pulse duration modulating a corresponding one of said PDM carrier signals in accordance therewith, each said PDM amplifier means having an output circuit;
   common filter means associated with said pair of PDM amplifier means for filtering the corresponding signals obtained from the output circuits of said pair of PDM amplifier means and providing output signals on a filter output line;
   means for coupling the output circuit of each said PDM amplifier means with said common filter means;
   a plurality of said pairs of PDM amplifier means and a like plurality of said common filter means;
   said coupling means includes a transformer coil having a first end connected to the output circuit of one of said PDM amplifier means of an associated said pair and a second end connected to the output circuit of the other said PDM amplifier means of the associated said pair; and,
   each said transformer coil has a center tap and each said filter means is connected to the center tap of one of said transformer coils.

3. A pulse duration modulation (PDM) amplifier system comprising:
   means for providing a plurality of PDM carrier signals of like frequency but unlike phase;
   a first pair of PDM amplifier means all responsive to a common modulating input signal for each pulse duration modulating a corresponding one of said PDM carrier signals in accordance therewith, each said PDM amplifier means having an output circuit;
   common filter means associated with said pair of PDM amplifier means for filtering the corresponding signals obtained from the output circuits of said pair of PDM amplifier means and providing output signals on a filter output line;
   means for coupling the output circuit of each said PDM amplifier means with said common filter means;
   a plurality of said pairs of PDM amplifier means and a common filter means coupled to the output circuits of each PDM amplifier means of all of said plurality of pairs of PDM amplifier means;
   said coupling means includes a transformer coil having a first end connected to the output circuit of one of said PDM amplifier means of a said associated pair and a second end connected to the output circuit of the other said PDM amplifier means of the said associated pair; and,
   said transformer coil has a center tap and the common filter means is connected to the center tap of each said transformer coil.

4. A pulse duration modulation (PDM) amplifier system comprising:
   means for providing a plurality of PDM carrier signals of like frequency but unlike phase;
   a plurality of pairs of PDM amplifier means all responsive to a common modulating input signal for each pulse duration modulating a corresponding one of said PDM carrier signals in accordance therewith;
   each said PDM amplifier means having an output circuit;
   means coupling the output circuits of said PDM amplifier means in each said pair of PDM amplifier means said coupling means including a transformer coil having a first end connected to the output circuit of one of said PDM amplifier means of a said associated pair and a second end connected to the output circuit of the other said PDM amplifier means of the said associated pair, said transformer coil having a center tap;

and common filter means connected to said center tap.

5. A system as set forth in claim 4 including a single common filter means connected to the coupling means.

6. A system as set forth in claim 4 including a common filter means for each pair of said PDM amplifier means.

* * * * *